(12) United States Patent
Qian et al.

(10) Patent No.: US 11,094,633 B2
(45) Date of Patent: Aug. 17, 2021

(54) BRIDGE DIE DESIGN FOR HIGH BANDWIDTH MEMORY INTERFACE

(71) Applicant: Intel Corporation, Santa Clara, CA (US)

(72) Inventors: Zhiguo Qian, Chandler, AZ (US); Kemal Aygun, Tempe, AZ (US); Dae-Woo Kim, Phoenix, AZ (US); Jackie C. Preciado, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/305,758

(22) PCT Filed: Jun. 30, 2016

(86) PCT No.: PCT/US2016/040490
§ 371 (c)(1),
(2) Date: Nov. 29, 2018

(87) PCT Pub. No.: WO2018/004620
PCT Pub. Date: Jan. 4, 2018

(65) Prior Publication Data
US 2019/0229056 A1 Jul. 25, 2019

(51) Int. Cl.
*H01L 23/538* (2006.01)
*H01L 25/065* (2006.01)
(Continued)

(52) U.S. Cl.
CPC ........ *H01L 23/538* (2013.01); *H01L 23/5383* (2013.01); *H01L 24/16* (2013.01);
(Continued)

(58) Field of Classification Search
CPC ... H01L 23/538; H01L 23/5383; H01L 24/16; H01L 25/0655; H01L 2924/15192;
(Continued)

(56) References Cited

U.S. PATENT DOCUMENTS 8,064,224 B2    11/2011  Mahajan et al.
2004/0238206 A1 12/2004  Reid et al.
(Continued)

FOREIGN PATENT DOCUMENTS

TW           201810581 A     3/2018
WO     WO-2018004620 A1     1/2018

OTHER PUBLICATIONS

"International Application Serial No. PCT/US2016/040490, International Search Report dated Mar. 31, 2017", 3 pgs.
(Continued)

*Primary Examiner* — Patricia D Reddington
(74) *Attorney, Agent, or Firm* — Schwegman Lundberg & Woessner, P.A.

(57) ABSTRACT

A microelectronic package bridge can comprising a plurality of ground layers, and a plurality of signal layers interwoven with the plurality of ground layers. Each of the signal layers can include a plurality of electrically conductive pathways. Each of the electrically conductive pathways can be arranged to form an electrical connection between one of a first plurality of bumps of a first die and one of a second plurality of bumps of a second die. Each of the plurality of electrically conductive pathways can have a length substantially equal to one another.

21 Claims, 7 Drawing Sheets

(51) Int. Cl.
*H01L 23/00* (2006.01)
*H01L 25/18* (2006.01)

(52) U.S. Cl.
CPC ...... *H01L 25/0655* (2013.01); *H01L 23/5381* (2013.01); *H01L 23/5385* (2013.01); *H01L 25/18* (2013.01); *H01L 2224/16227* (2013.01); *H01L 2924/1434* (2013.01); *H01L 2924/1436* (2013.01); *H01L 2924/15192* (2013.01)

(58) Field of Classification Search
CPC ............. H01L 2924/1434; H01L 25/18; H01L 2924/1436; H01L 2224/16227; H01L 23/5385; H01L 23/5381
See application file for complete search history.

(56) References Cited

U.S. PATENT DOCUMENTS

| | | | |
|---|---|---|---|
| 2009/0291573 A1* | 11/2009 | Eldridge | ............... B23K 20/004 439/68 |
| 2012/0007211 A1 | 1/2012 | Aleksov et al. | |
| 2014/0117552 A1* | 5/2014 | Qian | ................... H01L 23/5381 257/762 |
| 2014/0159228 A1 | 6/2014 | Teh et al. | |
| 2015/0102477 A1 | 4/2015 | Qian et al. | |
| 2016/0133552 A1 | 5/2016 | Roy et al. | |

OTHER PUBLICATIONS

"International Application Serial No. PCT/US2016/040490, Written Opinion dated Mar. 31, 2017", 6 pgs.

Braunisch, Henning, et al., "High-speed performance of Silicon Bridge die-to-die interconnects", Electrical Performance of Electronic Packaging and Systems (EPEPS), IEEE 20th Conference, (Oct. 23, 2011), 95-98.

Mahajan, Ravi, et al., "Embedded Multi-Die Interconnect Bridge (EMIB)—A High Density, High Bandwidth Packaging Interconnect", IEEE 66th Electronic Components and Technology Conference, (2016), 9 pgs.

"Taiwanese Application Serial No. 106116165, Office Action dated Aug. 26, 2020", w English translation, 11 pgs.

"Taiwanese Application Serial No. 106116165, Office Action dated Apr. 30, 2021", With English translation, 8 pages.

* cited by examiner

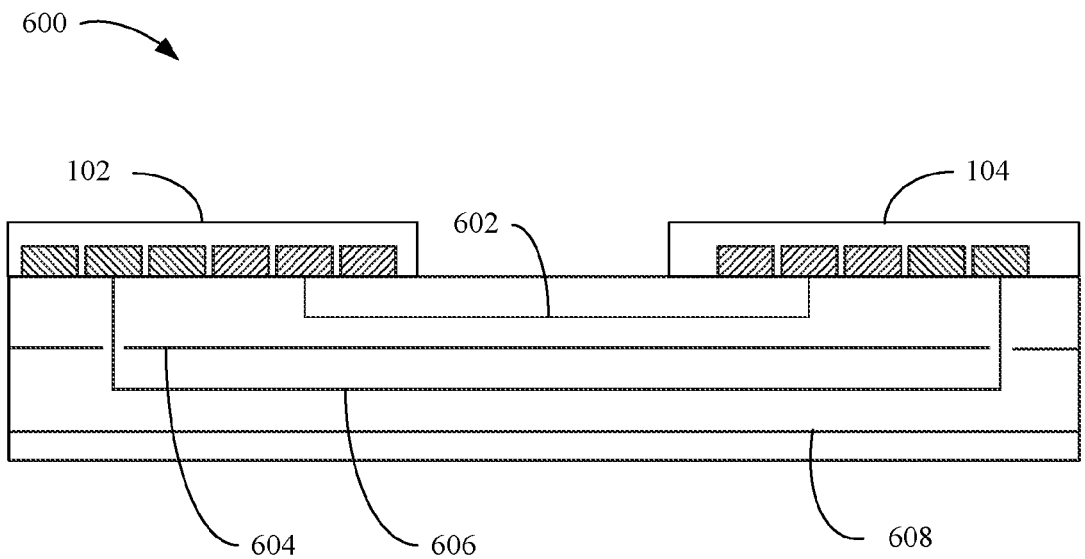
FIG. 6
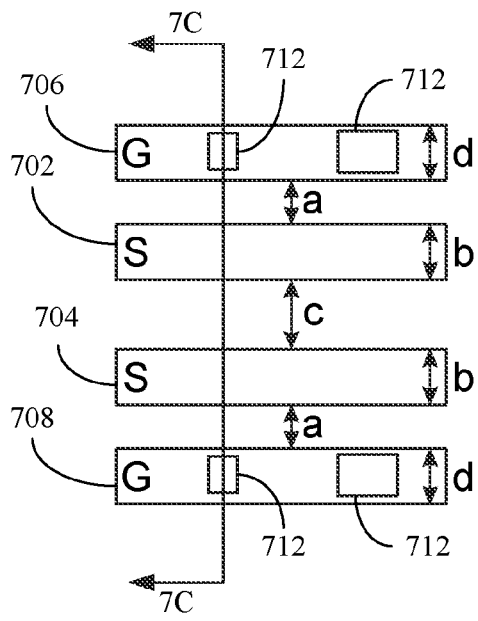 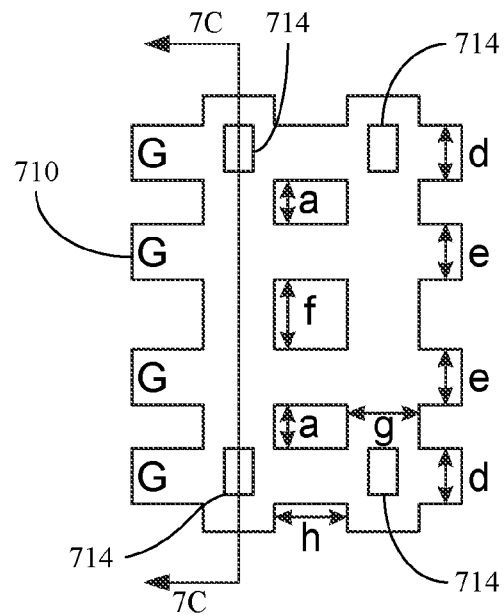
FIG. 7A                FIG. 7B

BRIDGE DIE DESIGN FOR HIGH BANDWIDTH MEMORY INTERFACE

CROSS-REFERENCE TO RELATED APPLICATION

This application is a U.S. National Stage Filing under 35 U.S.C. 371 from International Application No. PCT/US2016/040490, filed on Jun. 30, 2016, which application is incorporated herein by reference in its entirety.

TECHNICAL FIELD

Embodiments described generally herein relate to microelectronic packages. More particularly, embodiments described generally herein relate to electrical connections within microelectronic packages.

BACKGROUND

Microelectronics generally include a central processing unit (CPU). In order to enhance performance, CPU products are increasingly integrating multiple dies within the CPU package in a side-by-side or other multi-chip module (MCM) format. An embedded multi-die interconnect bridge (EMIB) is a way to electrically connecting multiple dies within a microelectronic package.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIG. 6 illustrates a bridge in accordance with some embodiments disclosed herein.

FIGS. 7A-7C illustrates a bridge routing design in accordance with some embodiments disclosed herein.

DETAILED DESCRIPTION

An EMIB can allow for dense microelectronic or multichip packaging. For example, one application of an EMIB can be to interconnect high-bandwidth memory (HBM) dies with a memory controller die. As disclosed herein, a bridge using properly spaced bump connections having an appropriate length can allow for low loss, low crosstalk, and low power consumption of an input/output (I/O) link between the controller dies and the memory dies.

As disclosed herein, using proper process and design rule capability, the bridge can allow for optimal electrical performance and power efficiency by utilizing a proper trace width/spacing, signal/ground placement, and routing strategy.

HBM devices in accordance with standards set forth by the Joint Electron Device Engineering Council (JEDEC) can provide large on-package memory bandwidth and can have about 1700 input/output (I/O) signals to connect to the memory controller in a limited space. Due to the high density capability of micro-bumping and routing, an EMIB can be a solution for this challenging multichip packaging.

As disclosed herein, EMIBs can include a plurality of electrically conductive pathways. Each of the electrically conductive pathways can include a length. The length of each of the electrically conductive pathways can be substantially the same. Stated another way, the length of each of the electrically conductive pathways can be within a given percentage, standard deviation, or length of each other. For instance, the length of each of the electrically conductive pathways can be X mm long +/−1%-2% or X mm long +/−Y μm.

In addition to having lengths that are substantially the same, the electrically conductive pathways can be spaced so as to maximize spacing between adjacent signal channels. As disclosed herein, maximizing spacing between signal channels can decrease cross-talk between signal channels.

Figure 1:
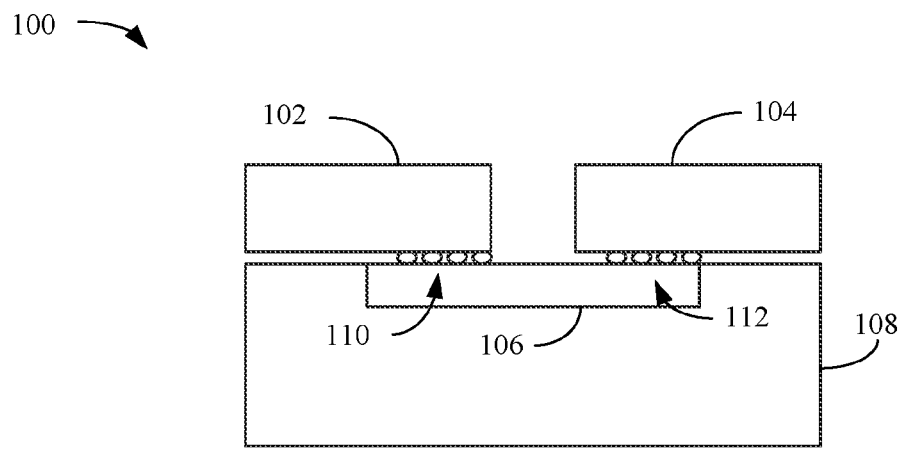
FIG. 1 illustrates a side view of a microelectronics package in accordance with some embodiments disclosed herein.

Turning now to the figures, FIG. 1 illustrates a side view of a microelectronic package 100 (sometimes referred to as multichip package) in accordance with embodiments disclosed herein. The microelectronic package 100 can include a first die 102, a second die 104, a bridge 106, and a substrate 108. The bridge 106 can be embedded into the substrate 108 and can connect a large amount of input/output (I/O) bumps between the first die 102 and the second die 104. For example, the first die 102 and the second die 104 can be electrically coupled by the bridge 106. The connections between the first die 102 and the bridge 106 can be a first plurality of bumps 110. The connections between the second die 104 and the bridge 106 can be a second plurality of bumps 112. In addition, the first die 102 can be a controller die and the second die 104 can be a memory die.

The bumps can be arranged in a face-centered rectangular (FCR) pattern with a specified bump pitch. For example, the bumps can be arranged FCR with a 55 micrometer bump pitch.

Figure 2:
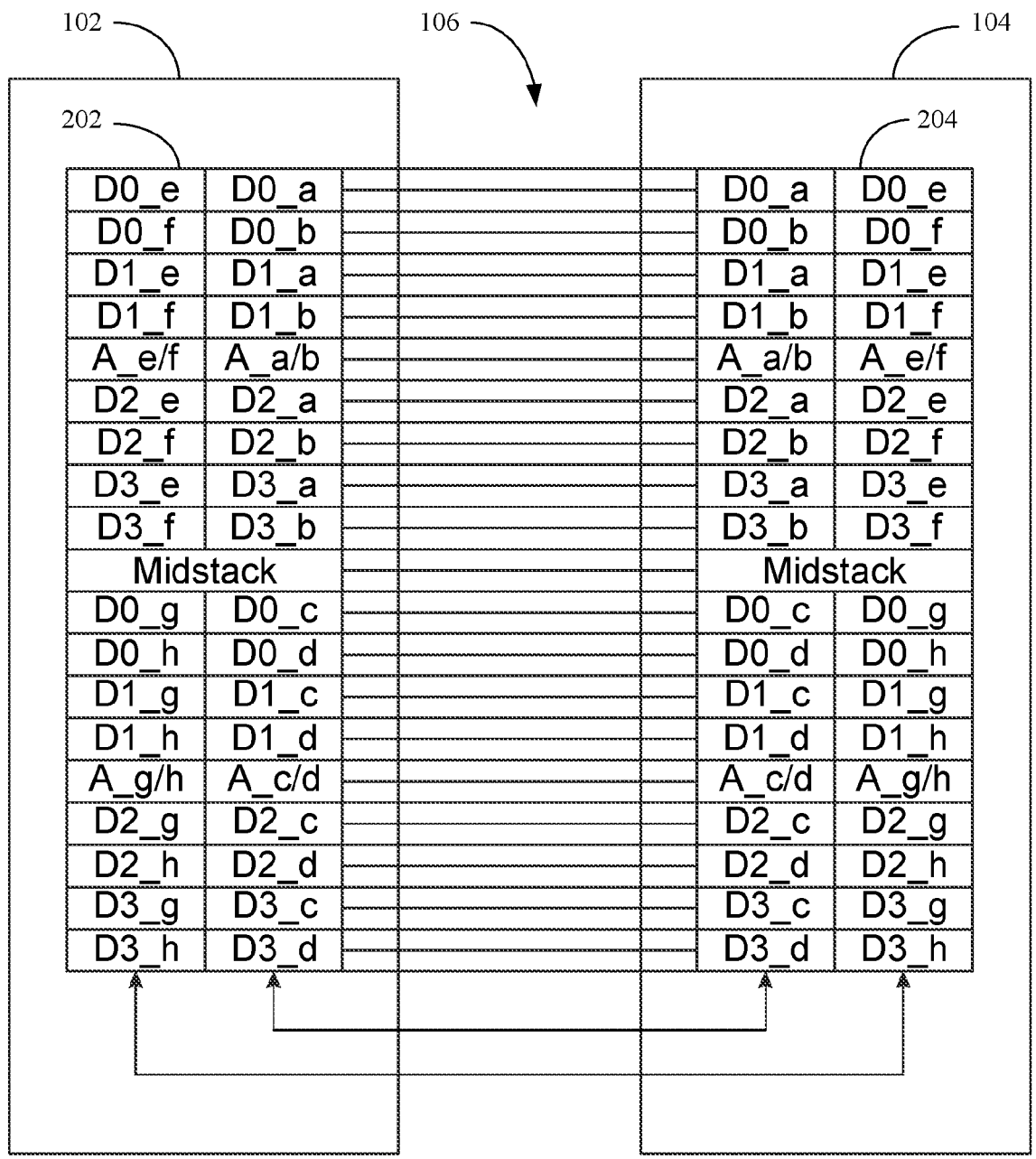
FIG. 2 illustrates a top view of a mirrored input/output region of a bridge in accordance with some embodiments disclosed herein.
Figure 3:
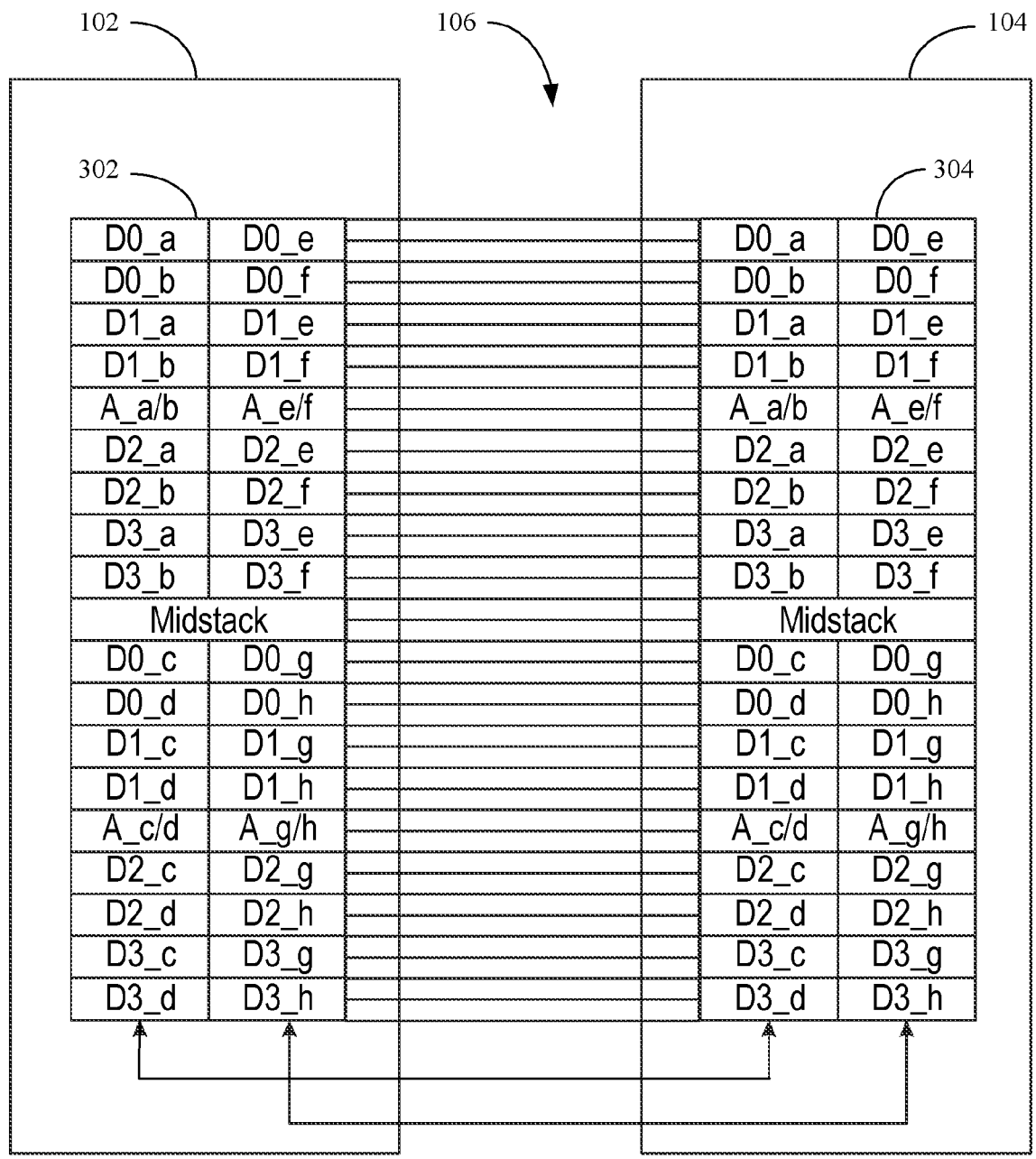
FIG. 3 illustrates a top view of a copied input/output region of a bridge in accordance with some embodiments disclosed herein.

As shown in FIGS. 2 and 3, the bumps can be organized into DWORD and AWORD blocks. FIG. 2 illustrates a top view of a mirrored I/O region of a bridge (such as the bridge 106) in accordance with some embodiments. FIG. 3 illustrates a top view of a copied I/O region of a bridge in accordance with some embodiments disclosed herein. The various bumps can create a bump pattern. The bump pattern of the first die 102 can be different than the bump pattern of the second die 104. The bump pattern of the first die 102 and the bump pattern of the second die 104 can be the same. The I/O connections can be broken down to a block level which simplifies designing the electrically conductive pathways. For example, as shown in FIGS. 2 and 3, there can be two columns of blocks 202, 204, 302, and 304.

As shown in FIGS. 2 and 3, the two columns of the blocks 202, 204, 302, 304 can be organized two ways. FIG. 2 shows a mirrored design for blocks 202 and 204. The blocks 302 and 304 can be a copied design as shown in FIG. 3. In either a mirrored or copied design, the block assignments can remain the same in vertical direction. As shown in FIGS. 2 and 3, the I/O interconnects to be implemented within a block height can be easily repeated. For example, the interconnect design of the blocks D0_e and D0_a can be simply copied to reduce the design complexity.

Figure 4:
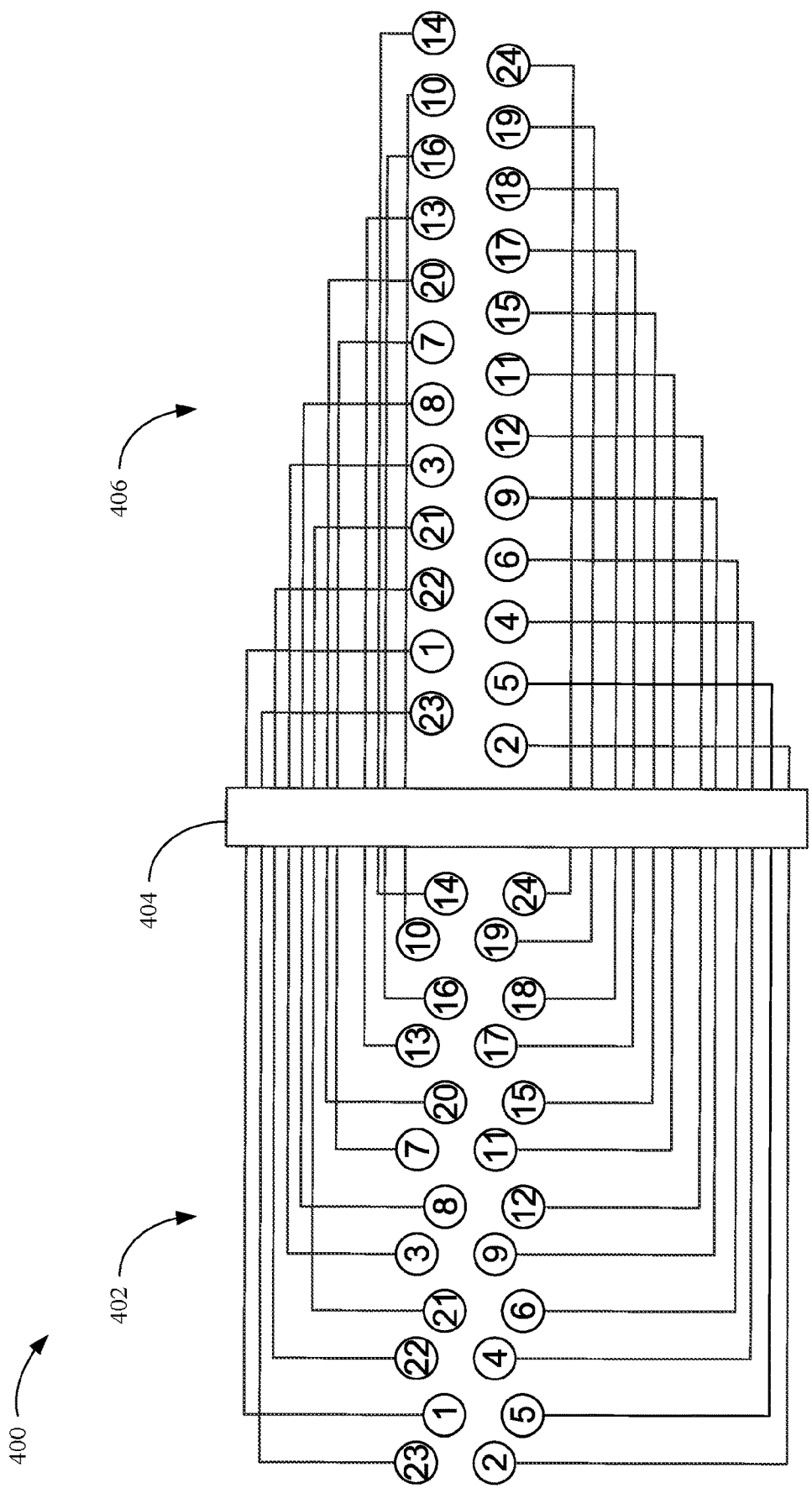
FIG. 4 illustrates a block design of a bump pattern in accordance with some embodiments disclosed herein.

FIG. 4 shows a block design of a bump pattern 400 in accordance with some embodiments disclosed herein. For example, FIG. 4 can represent the interconnect design for 24 signals in block D0_a. As shown in FIG. 4, the interconnect design can be divided into three regions, a memory bump region 402, an open region 404, and a controller bump region 406. The open region 404 in the middle can be an extension of the electrically conductive pathways, sometimes referred to as connecting traces. A length of the open region 404 can be determined by a distance between I/O bump blocks, such as the memory bump region 402 and the controller bump region 406.

As shown in FIG. 4, each bump 1-24 in the memory bump region 402 can correspond to each bump 1-24 in the controller bump region 406. Each of the bumps 1-24 in the memory bump region 402 can be connected to a corresponding bump 1-24 in the controller bump region 406 using an electrically conductive pathway, or trace. As a result, in the example shown in FIG. 4, there can be 24 electrically conductive pathways in the bridge 106 connecting the various bumps to carry signals between the first die 102 and the second die 104. The memory bump region 402 can correspond to a memory die (such as the second die 104) and the controller bump region 406 can correspond to a controller die (such as the first die 102). Each of the electrically conductive pathways can be chosen so as to match the bump-to-bump distance among all the 24 signals. Stated another way, the bump-to-bump distance, or the length of each of the electrically conductive pathways, can be substantially equal to one another. Having the bump-to-bump distance of all 24 signals being substantially equal helps to ensure that all the signals are accurately aligned in timing to optimize the sampling point for better performance. While FIG. 4 shows 24 bumps, the various dies can have any number of bumps.

As an example of bump-to-bump distances, the shortest distance from corresponding bumps 14 can be 5 mm. The shortest distance from corresponding bumps 2 can be 4 mm. As a result, the bump-to-bump distance for corresponding bumps 2 needs to be lengthened so that the bump-to-bump distances are substantially the same. As disclosed herein, the length of each of the electrically conductive pathways (bump-to-bump distance) can be X mm long +/−Y %-Z % or X mm long +/−W In this example, X can be 5 mm, Y can be 1%, Z can be 2%, or W can be 50 µm. As a result, the electrically conductive pathway between corresponding bumps 2 can be 5 mm +/−1%-2% or 5 mm +/−50 µm.

As can be seen in FIG. 4, as the number of bumps increase, the ability to have simple straight connections between bumps becomes increasingly difficult. In addition, given the location of corresponding bumps, the electrically conductive pathway may need to be extended in order for all of the bump-to-bump distances to be substantially equal. For example, the distance between corresponding bumps 14 may be the greatest within the microelectronic package 100. As a result, the distance between a number of the remaining bumps may need to be increased in order for all the bump-to-bump distances to be substantially equal. In order to increase the length of various electrically conductive pathways, the electrically conductive pathways can span multiple layers of the bridge 106. In other words, the layout implementation for the various electrically conductive pathways can use a vertical trace to complete a connection and extend the length of the connection.

Figure 5:
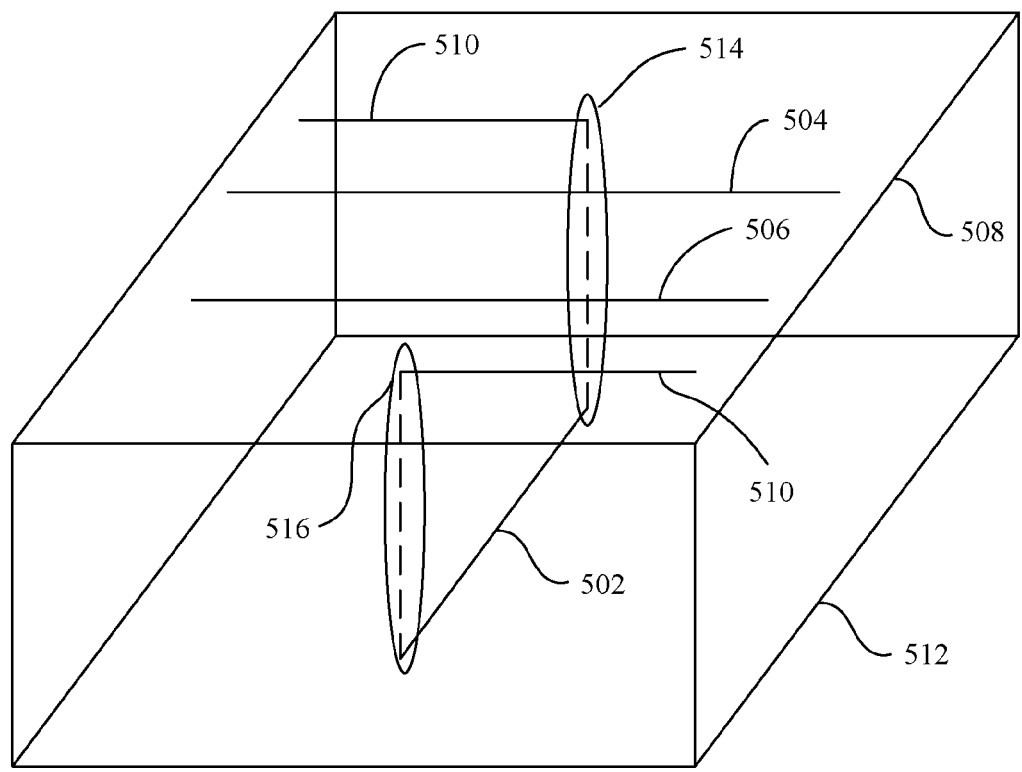
FIG. 5 illustrates a jump wire design in accordance with some embodiments disclosed herein.

In addition, since there are many signal traces, it is unavoidable that some vertical traces may need to cross the horizontal trace of other signals. As shown in FIG. 5, a jump-wire 502 can pass through an adjacent ground layer to accomplish the crossing. For example, as shown on FIG. 5, a first signal 504 and a second signal 506 can run parallel to one another in a first signal layer 508. A third signal 510 may need to cross the pathways of the first signal 504 and the second signal 506. The jump-wire 502 can be used to place a vertical segment in an adjacent ground layer 512 and connect to the horizontal segments with vias 514 and 516. Grounding structures and other signals have been omitted from FIG. 5 for clarity.

FIG. 6 illustrates a bridge 600 in accordance with some embodiments disclosed herein. The bridge 600 can include a first layer 602, a second layer 604, a third layer 606, and a fourth layer 608. While FIG. 6 shows four layers, the bridge 600 can include any number of layers. The layers 602, 604, 606, and 608 can be constructed of metals with dielectric interlayers. For example, metal layers can be 1 to 4 micrometers thick and interlayer dielectrics can be 1 to 4 micrometers thick depending on the silicon (Si) process used to fabricate the bridge 600. The first layer 602 and the third layer 606 can be metal layers that can be used for signal routing, sometimes referred to as signal layers. The second layer 604 and the fourth layer 608 can be metal layers that can be used for ground reference, sometimes referred to as ground layers.

Using an example mirrored block assignment, the D0_a blocks can be connected through the first layer 602. The D0_e blocks can mainly connect through the third layer 606. As a result, signals of different blocks are separated into different layers with ground isolation to reduce the crosstalk between different DWORDs and AWORDs.

The signal layers (e.g., the first layer 602 and the third layer 606) can be comprised of dense traces (i.e., electrically conductive pathways). As an example, two thirds (or any other ratio) of traces can be signals and one third of the traces can be used as ground references. For example, as shown in FIG. 7A, the signals and ground traces can follow a two signals and one ground pattern. The traces can be about 1 micron to 4 microns wide. Narrower traces can deteriorate the signaling performance due to the significantly higher resistive loss, while wider trace can also be undesirable because due to large capacitance as well as higher crosstalk between channels. As shown in FIG. 7A, the signal traces 702 and 704 can be deliberately placed closer to the adjacent ground traces 706 and 708 to increase the spacing between them for less crosstalk. Stated another way, c can be greater than a as shown in FIG. 7A.

FIG. 7A shows the ground traces 706 and 708 in the first layer 602 and the third layer 606. The ground traces in the first layer 602 and the third layer 606 can not only shield crosstalk between the signals, but also provide vias 712 to connect to ground traces in adjacent layers.

The ground layers (i.e., the second layer 604 and the fourth layer 608) can be constructed of meshed planes as shown in FIG. 7B. The horizontal ground traces can be placed underneath every trace in an adjacent signal layer. For example, ground trace 710 can be placed underneath signal trace 702 in the bridge 600. Ground traces underneath a signal trace can be deliberately designed wider to improve the return path quality and increase the crosstalk shielding. For example, as shown in FIGS. 7A and 7B, e can be greater than b. The vertical ground traces can be placed according to the metal density requirements of the manufacturing process. Vias 714 can be placed at the crossing points to connect ground structures in adjacent layers.

Figure 7C:
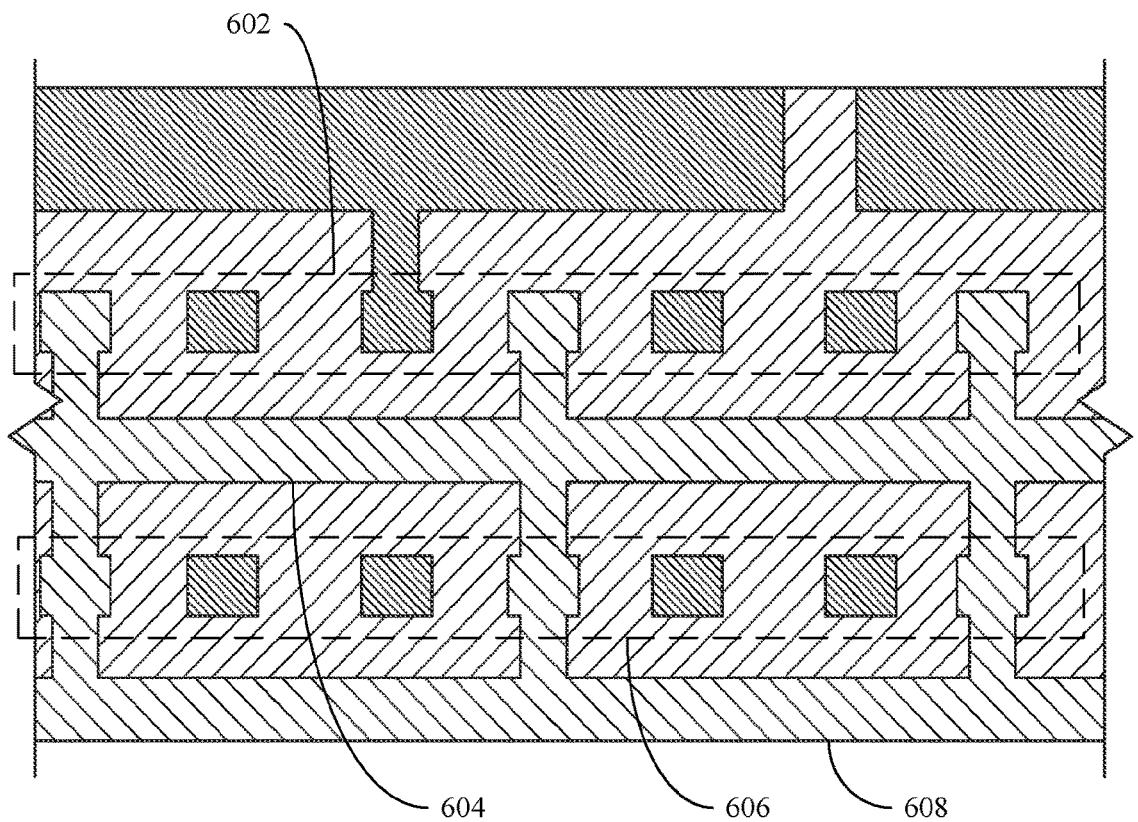

FIG. 7C shows a cross-section of the routing design shown in FIGS. 7A and 7B. As shown in FIG. 7C, a two-to-one signal-to-ground ratio of traces in the first layer 602 and the third layer 606 and the well-connected ground reference structure spans across all four layers 602, 604, 606, and 608. While FIGS. 6-7C show the first layer 602 and the third layer 606 being signal layers and the second layer 604 and the fourth layer 608 being ground layers, the assignment of signal and ground layers can be swapped. For example, the first layer 602 and the third layer 606 can be ground layers and the second layer 604 and the fourth layer 608 can be signal layers.

Figure 8:
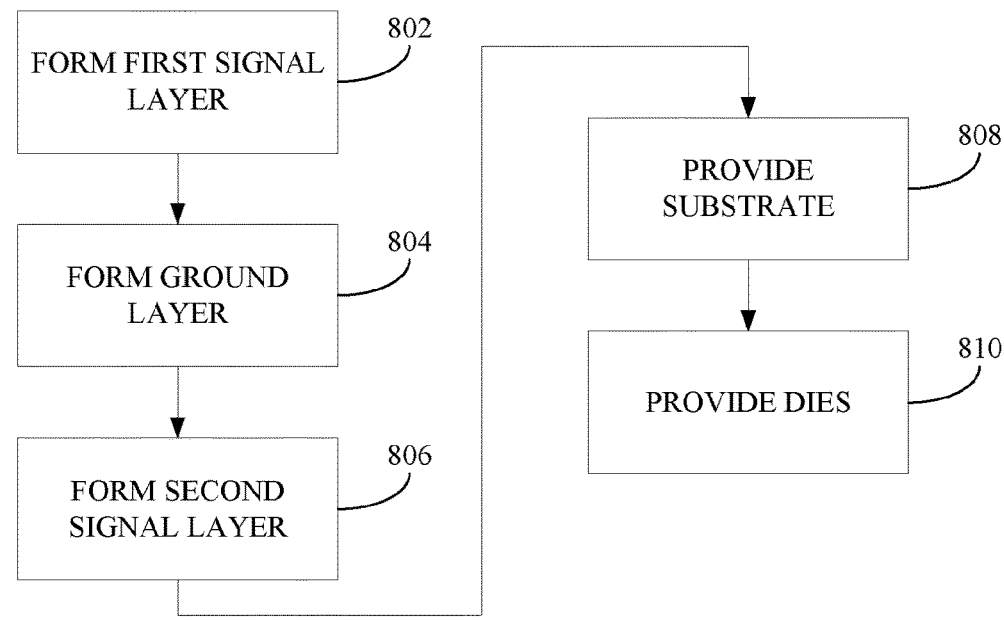
FIG. 8 illustrates method for manufacturing a microelectronic package in accordance with some embodiments disclosed herein.

FIG. 8 illustrates a method 800 for manufacturing a microelectronic package, such as microelectronic package 100, in accordance with some embodiments disclosed herein. The method 800 can begin at stage 802 where a first signal layer (such as the third layer 606) can be formed. The first signal layer can include a plurality of electrically conductive pathways. The electrically conductive pathways can be used to connect various bumps.

From stage 802, the method can proceed to stage 804 where a ground layer can be formed. From stage 804, the method 800 can proceed to stage 806 where a second signal layer (such as the first layer 602) can be formed. The second signal layer can include a plurality of electrically conductive pathways that can be used to connect various bumps.

The ground layer can be positioned in between the first signal layer and the second signal layer. Stated another way, the ground layer, or ground layers if there are multiple ground layers, can be interwoven with the first and second signal layers, or other signal layers if there are more than two signal layers.

As disclosed herein the plurality of electrically conductive pathways can be substantially equal to one another. This does not mean that all the electrically conductive pathways in a single layer or in each layer are substantially equal to one another. The electrically conductive pathway connecting corresponding bumps (such as bumps 14) can span multiple layers and the various segments in each layer need not be equal. Instead, the overall length of the electrically conductive pathway connecting corresponding bumps are substantially equal.

From stage 806, the method 800 can proceed to stage 808 where a substrate (such as the substrate 108) can be provided. The various signal and ground layers provided can be formed as a bridge (such as the bridge 106) and then placed into or onto the substrate.

From stage 808, the method 800 can proceed to stage 810 where a plurality of dies (such as the first die 102 and the second die 104) can be provided. The plurality of dies can be placed in proper locations such that the electrically conductive pathways connect the proper corresponding bumps. The dies can then be placed into position and attached to complete the package. In addition, the various layers can be provided and the traces laid out with the dies in place and then everything connected in a single manufacturing process.

Figure 9:
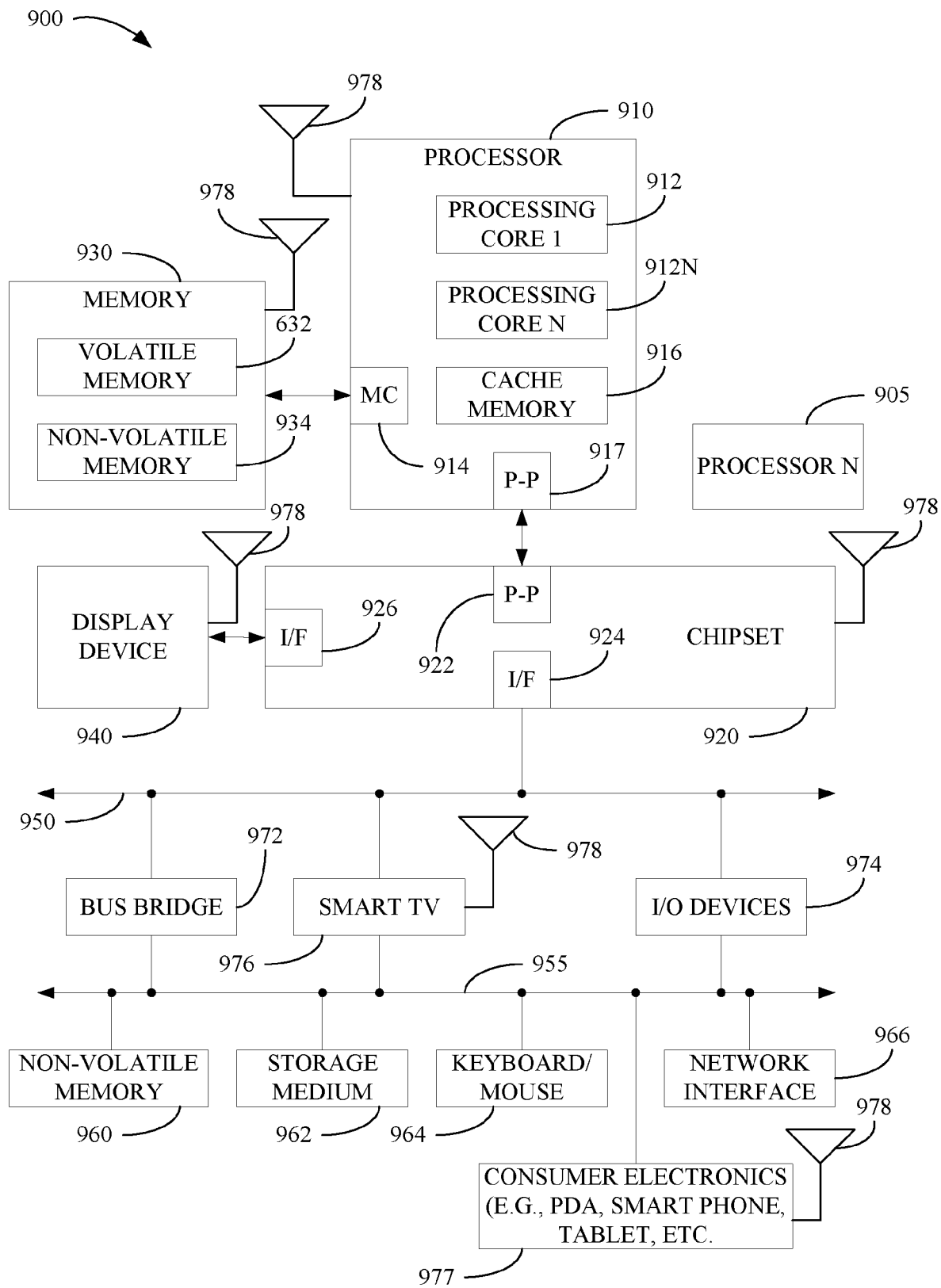
FIG. 9 illustrates a system level diagram in accordance with some embodiments disclosed herein.

FIG. 9 illustrates a system level diagram in accordance with some embodiments disclosed herein. For instance, FIG. 9 depicts an example of an electronic device (e.g., system) including the microelectronics package 100 as described above. FIG. 9 is included to show an example of a higher level device application for the microelectronics package 100. In one embodiment, system 900 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance, or any other type of computing device. In some embodiments, system 900 is a system on a chip (SOC) system.

In one embodiment, processor 910 has one or more processing cores 912 and 912N, where 912N represents the Nth processor core inside processor 910 where N is a positive integer. In one embodiment, system 900 includes multiple processors including 910 and 905, where processor 905 has logic similar or identical to the logic of processor 910. In some embodiments, processing core 912 includes, but is not limited to, pre-fetch logic to fetch instructions, decode logic to decode the instructions, execution logic to execute instructions and the like. In some embodiments, processor 910 has a cache memory 916 to cache instructions and/or data for system 900. Cache memory 916 may be organized into a hierarchal structure including one or more levels of cache memory.

In some embodiments, processor 910 includes a memory controller 914, which is operable to perform functions that enable the processor 910 to access and communicate with memory 930 that includes a volatile memory 932 and/or a non-volatile memory 934. In some embodiments, processor 910 is coupled with memory 930 and chipset 920. Processor 910 may also be coupled to a wireless antenna 978 to communicate with any device configured to transmit and/or receive wireless signals. In one embodiment, the wireless antenna interface 978 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 932 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 934 includes, but is not limited to, flash memory, phase change memory (PCM), read-only memory (ROM), electrically erasable programmable read-only memory (EEPROM), or any other type of non-volatile memory device.

Memory 930 stores information and instructions to be executed by processor 910. In one embodiment, memory 930 may also store temporary variables or other intermediate information while processor 910 is executing instructions. In the illustrated embodiment, chipset 920 connects with processor 910 via Point-to-Point (PtP or P-P) interfaces 917 and 922. Chipset 920 enables processor 910 to connect to other elements in system 900. In some embodiments of the invention, interfaces 917 and 922 operate in accordance with a PtP communication protocol such as the Intel® QuickPath Interconnect (QPI), or the like. In other embodiments, a different interconnect may be used.

In some embodiments, chipset 920 is operable to communicate with processor 910, 905N, display device 940, and other devices 972, 976, 974, 960, 962, 964, 966, 977, etc. Chipset 920 may also be coupled to a wireless antenna 978 to communicate with any device configured to transmit and/or receive wireless signals.

Chipset 920 connects to display device 940 via interface 926. Display 940 may be, for example, a liquid crystal display (LCD), a plasma display, cathode ray tube (CRT) display, or any other form of visual display device. In some embodiments, processor 910 and chipset 920 are merged into a single SOC. In addition, chipset 920 connects to one or more buses 950 and 955 that interconnect various elements 974, 960, 962, 964, and 966. Buses 950 and 955 may be interconnected together via a bus bridge 972. In one embodiment, chipset 920 couples with a non-volatile memory 960, a mass storage device(s) 962, a keyboard/mouse 964, and a network interface 966 via interface 924 and/or 904, smart TV 976, consumer electronics 977, etc.

In one embodiment, mass storage device 962 includes, but is not limited to, a solid state drive, a hard disk drive, a universal serial bus flash memory drive, or any other form of computer data storage medium. In one embodiment, any type of well-known network interface standard including, but not limited to, an Ethernet interface, a universal serial bus (USB) interface, a Peripheral Component Interconnect (PCI) Express interface, a wireless interface, and/or any other suitable type of interface implement network interface 966. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 9 are depicted as separate blocks within the system 900, the functions performed by some of these blocks may be integrated within a single semiconductor circuit or may be implemented using two or more separate integrated circuits. For example, although cache memory 916 is depicted as a separate block within processor 910, cache memory 916 (or selected aspects of 916) can be incorporated into processor core 912.

Additional Notes & Examples

Example 1 includes a microelectronic package. The microelectronic package can comprise a first die, a second die, and a bridge. The first die can include a first plurality of bumps defining a first bump pattern. The second die can include a second plurality of bumps defining a second bump pattern. The bridge can include a plurality of ground layers and a plurality of signal layers. The plurality of signal layers can be interwoven with the plurality of ground layers. Each of the signal layers can include a plurality of electrically conductive pathways. Each of the electrically conductive pathways can form an electrical connection between one of the first plurality of bumps and one of the second plurality of bumps. Each of the plurality of electrically conductive pathways can have a length substantially equal to one another.

In Example 2, the microelectronic package of Example 1 can optionally include the length of each of the plurality of electrically conductive pathways being within about 1% to about 2% of one another.

In Example 3, the microelectronic package of Example 1 can optionally include the length of each of the plurality of electrically conductive pathways varying by less than 100 microns.

In Example 4, the microelectronic package of any one of or any combination of Examples 1-3 can optionally include each of the signal layers further including a plurality of ground pathways.

In Example 5, the microelectronic package of Example 4 can optionally include a distance between each of the plurality of electrically conductive pathways within a respective signal layer being maximized and a distance between at least one of the electrically conductive pathways and at least one of the plurality of ground pathways within the respective signal layer being minimized.

In Example 6, the microelectronic package of any one of or any combination of Examples 1-3 can optionally include each of the signal layers includes a plurality of ground connections.

In Example 7, the microelectronic package of any one of or any combination of Examples 1-6 can optionally include each of the plurality of ground layers including a plurality of ground pathways forming a grid within a respective ground layer of the plurality of ground layers.

In Example 8, the microelectronic package of any one of or any combination of Examples 1-7 can optionally include a first subset of the plurality of electrically conductive pathways being confined to a first signal layer and a second subset of the plurality of electrically conductive pathways spanning multiple signal layers.

In Example 9, the microelectronic package of any one of or any combination of Examples 1-8 can optionally include the first bump pattern being different from the second bump pattern.

In Example 10, the microelectronic package of any one of or any combination of Examples 1-9 can optionally include the first die being a control die and the second die being a memory die.

Example 11 can include a microelectronic package. The microelectronic package can comprise a first die, a second die, and a bridge. The first die can include a first plurality of bumps defining a first bump pattern. The second die can include a second plurality of bumps defining a second bump pattern. The bridge can include a first ground layer, a second ground layer, a first signal layer, and a second signal layer. The first signal layer can be adjacent the first ground layer. The first signal layer can include a first plurality of electrically conductive pathways. Each of the first plurality of electrically conductive pathways can form an electrical connection between one of a first subset of the first plurality of bumps and a first corresponding subset of the second plurality of bumps. The second signal layer can be in between the first ground layer and the second ground layer. The second signal layer can include a second plurality of electrically conductive pathways. Each of the second plurality of electrically conductive pathways can form an electrical connection between one of a second subset of the first plurality of bumps and a second corresponding subset of the second plurality of bumps. Each of the first plurality of electrically conductive pathways and each of the second plurality of electrically conductive pathways can have a length substantially equal to one another.

In Example 12, the microelectronic package of Example 11 can optionally include the length of each of the first plurality of electrically conductive pathways and each of the second plurality of electrically conductive pathways being within about 1% to about 2% of one another.

In Example 13, the microelectronic package of Example 11 can optionally include the length of each of the first plurality of electrically conductive pathways and each of the second plurality of electrically conductive pathways varying by less than 100 microns.

In Example 14, the microelectronic package of any one of or any combination of Examples 11-13 can optionally include the first signal layer and the second signal layer each including a plurality of ground pathways.

In Example 15, the microelectronic package of Example 14 can optionally include a distance between each of the plurality of electrically conductive pathways within a respective signal layer being maximized and a distance between at least one of the electrically conductive pathways and at least one of the plurality of ground pathways within the respective signal layer being minimized.

In Example 16, the microelectronic package of any one of or any combination of Examples 11-15 can optionally include each of the second plurality of electrically conductive pathways passing through a corresponding via to an adjacent ground layer.

In Example 17, the microelectronic package of any one of or any combination of Examples 11-16 can optionally include the first bump pattern being different from the second bump pattern.

In Example 18, the microelectronic package of any one of or any combination of Examples 11-17 can optionally include the first die being a control die and the second die being a memory die.

Example 19 can include a method of manufacturing a microelectronic package. The method comprising: forming a first plurality of electrically conductive pathways in a first signal layer; forming a second plurality of electrically conductive pathways in a second signal layer; and forming a ground layer positioned between the first signal layer and the second signal layer, the ground layer defining a plurality of vias, each of the second plurality of electrically conductive pathways passing through a respective via, wherein forming the first plurality of electrically conductive pathways and the second plurality of electrically conductive pathways includes forming each of the first plurality of electrically conductive pathways and each of the second plurality of electrically conductive pathways such that each has a length substantially equal to one another.

In Example 20, the method of Example 19 can optionally include forming each of the first plurality of electrically conductive pathways and each of the second plurality of electrically conductive pathways such that each has a length substantially equal to one another including forming each of the first plurality of electrically conductive pathways and each of the second plurality of electrically conductive pathways such that the length of each of the first plurality of electrically conductive pathways and each of the second plurality of electrically conductive pathways is within about 1% to about 2% of one another.

In Example 21, the method of Example 19 can optionally include forming each of the first plurality of electrically conductive pathways and each of the second plurality of electrically conductive pathways such that each has a length substantially equal to one another including forming each of the first plurality of electrically conductive pathways and each of the second plurality of electrically conductive pathways such that the length of each of the first plurality of electrically conductive pathways and each of the second plurality of electrically conductive pathways varies by less than 100 microns.

In Example 22, the method of any one of or any combination of Examples 19-21 can optionally include forming a plurality of ground pathways in each of the first signal layer and the second signal layer.

In Example 23, the method of Example 22 can optionally include forming each of the first plurality of electrically conductive pathways and each of the second plurality of electrically conductive pathways such that each has a length substantially equal to one another including forming each of the first plurality of electrically conductive pathways and each of the second plurality of electrically conductive pathways such that a distance between each of the plurality of electrically conductive pathways within a respective signal layer is maximized and a distance between at least one of the electrically conductive pathways and at least one of the plurality of ground pathways within the respective signal layer is minimized.

In Example 24, the method of any one of or any combination of Examples 19-23 can optionally include attaching a first die and a second die to the first plurality of electrically conductive pathways and the second plurality of electrically conductive pathways such that an electrical connection is formed between a bump of the first die and bump of the second die.

In Example 25, the method of Example 24 can optionally include the first die being a control die and the second die being a memory die.

Example 26 can include a microelectronic package bridge. The microelectronic package bridge can comprise a plurality of ground layers and a plurality of signal layers. The plurality of signal layers can be interwoven with the plurality of ground layers. Each of the signal layers can include a plurality of electrically conductive pathways. Each of the electrically conductive pathways can be arranged to form an electrical connection between one of a first plurality of bumps of a first die and one of a second plurality of bumps of a second die. Each of the plurality of electrically conductive pathways can have a length substantially equal to one another.

In Example 27, the microelectronic package bridge of Example 26 can optionally include the length of each of the plurality of electrically conductive pathways being within about 1% to about 2% of one another.

In Example 28, the microelectronic package bridge of Example 26 can optionally include the length of each of the plurality of electrically conductive pathways varying by less than 100 microns.

In Example 29, the microelectronic package bridge of any one of or any combination of Examples 26-28 can optionally include each of the signal layers further including a plurality of ground pathways.

In Example 30, the microelectronic package bridge of Example 29 can optionally include a distance between each of the plurality of electrically conductive pathways within a respective signal layer being maximized and a distance between at least one of the electrically conductive pathways and at least one of the plurality of ground pathways within the respective signal layer being minimized.

In Example 31, the microelectronic package bridge of any one of or any combination of Examples 26-28 can optionally include each of the signal layers including a plurality of ground connections.

In Example 32, the microelectronic package bridge of any one of or any combination of Examples 26-31 can optionally include each of the plurality of ground layers including a plurality of ground pathways forming a grid within a respective ground layer of the plurality of ground layers.

In Example 33, the microelectronic package of bridge any one of or any combination of Examples 26-32 can optionally include a first subset of the plurality of electrically conductive pathways being confined to a first signal layer and a second subset of the plurality of electrically conductive pathways spanning multiple signal layers.

In Example 34, the microelectronic package bridge of any one of or any combination of Examples 26-33 can optionally include a first bump pattern being different from a second bump pattern.

In Example 35, the microelectronic package bridge of any one of or any combination of Examples 26-34 can optionally include the first die being a control die and the second die being a memory die.

Example 36 can include a microelectronic package bridge. The microelectronic package bridge can comprise a first ground layer, a second ground layer, a first signal layer, and a second signal layer. The first signal layer can be adjacent the first ground layer. The first signal layer can include a first plurality of electrically conductive pathways. Each of the first plurality of electrically conductive pathways can be arranged to form an electrical connection between one of a first subset of a first plurality of bumps of a first die and a first corresponding subset of a second plurality of bumps of a second die. The second signal layer can be in between the first ground layer and the second ground layer. The second signal layer can include a second plurality of electrically conductive pathways. Each of the second plurality of electrically conductive pathways can be arranged to form an electrical connection between one of a second subset of the first plurality of bumps and a second corresponding subset of the second plurality of bumps. Each of the first plurality of electrically conductive pathways and each of the second plurality of electrically conductive pathways can have a length substantially equal to one another.

In Example 37, the microelectronic package bridge of Example 36 can optionally include the length of each of the first plurality of electrically conductive pathways and each of the second plurality of electrically conductive pathways being within about 1% to about 2% of one another.

In Example 38, The microelectronic package of Example 36 can optionally include the length of each of the first plurality of electrically conductive pathways and each of the second plurality of electrically conductive pathways varying by less than 100 microns.

In Example 39, the microelectronic package of any one of or any combination of Examples 36-38 can optionally include the first signal layer and the second signal layer each including a plurality of ground pathways.

In Example 40, the microelectronic package of Example 39 can optionally include a distance between each of the plurality of electrically conductive pathways within a respective signal layer being maximized and a distance between at least one of the electrically conductive pathways and at least one of the plurality of ground pathways within the respective signal layer being minimized.

In Example 41, the microelectronic package of any one of or any combination of Examples 36-40 can optionally include each of the second plurality of electrically conductive pathways passing through a corresponding via formed by the first ground layer.

In Example 42, the microelectronic package of any one of or any combination of Examples 36-41 can optionally include the first die being a control die and the second die being a memory die.

The above detailed description includes references to the accompanying drawings, which form a part of the detailed description. The drawings show, by way of illustration, specific embodiments that may be practiced. These embodiments are also referred to herein as "examples." Such examples may include elements in addition to those shown or described. However, also contemplated are examples that include the elements shown or described. Moreover, also contemplate are examples using any combination or permutation of those elements shown or described (or one or more aspects thereof), either with respect to a particular example (or one or more aspects thereof), or with respect to other examples (or one or more aspects thereof) shown or described herein.

Publications, patents, and patent documents referred to in this document are incorporated by reference herein in their entirety, as though individually incorporated by reference. In the event of inconsistent usages between this document and those documents so incorporated by reference, the usage in the incorporated reference(s) are supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to suggest a numerical order for their objects.

The above description is intended to be illustrative, and not restrictive. For example, the above-described examples (or one or more aspects thereof) may be used in combination with others. Other embodiments may be used, such as by one of ordinary skill in the art upon reviewing the above description. The Abstract is to allow the reader to quickly ascertain the nature of the technical disclosure and is submitted with the understanding that it will not be used to interpret or limit the scope or meaning of the claims. Also, in the above Detailed Description, various features may be grouped together to streamline the disclosure. However, the claims may not set forth features disclosed herein because embodiments may include a subset of said features. Further, embodiments may include fewer features than those disclosed in a particular example. Thus, the following claims are hereby incorporated into the Detailed Description, with a claim standing on its own as a separate embodiment. The scope of the embodiments disclosed herein is to be determined with reference to the appended claims, along with the full scope of equivalents to which such claims are entitled.

The invention claimed is:

1. A microelectronic package bridge comprising:
a plurality of ground layers, and
a plurality of signal layers interwoven with the plurality of ground layers, each of the signal layers including a plurality of electrically conductive pathways, each of the electrically conductive pathways arranged to form an electrical connection between one of a first plurality of bumps of a first die and one of a second plurality of bumps of a second die,
wherein, each of the plurality of electrically conductive pathways has a length substantially equal to one another,
wherein each of the signal layers further includes a plurality of ground pathways, and
wherein a first distance is between each of the plurality of electrically conductive pathways within a respective signal layer and a second distance is between at least one of the electrically conductive pathways and at least one of the plurality of ground pathways within the respective signal layer, wherein the second distance is smaller with respect to the first distance.

2. The microelectronic package bridge of claim 1, wherein the length of each of the plurality of electrically conductive pathways is within about 1% to about 2% of one another.

3. The microelectronic package bridge of claim 1, wherein the length of each of the plurality of electrically conductive pathways varies by less than 100 microns.

4. The microelectronic package bridge of claim 1, wherein each of the signal layers includes a plurality of ground connections.

5. The microelectronic package bridge of claim 1, wherein each of the plurality of ground layers includes a plurality of ground pathways forming a grid within a respective ground layer of the plurality of ground layers.

6. The microelectronic package bridge of claim 1, wherein a first subset of the plurality of electrically conductive pathways are confined to a first signal layer and a second subset of the plurality of electrically conductive pathways span multiple signal layers.

7. The microelectronic package bridge of claim 1, wherein the first bump pattern is different from the second bump pattern.

8. The microelectronic package bridge of claim 1, wherein the first die is a control die and the second die is a memory die.

9. A microelectronic package bridge comprising:
a first ground layer,
a second ground layer,
a first signal layer adjacent the first ground layer, the first signal layer including a first plurality of electrically conductive pathways, each of the first plurality of electrically conductive pathways arranged to form an electrical connection between one of a first subset of a first plurality of bumps of a first die and a first corresponding subset of a second plurality of bumps of a second die, and
a second signal layer in between the first ground layer and the second ground layer, the second signal layer including a second plurality of electrically conductive pathways, each of the second plurality of electrically conductive pathways arranged to form an electrical connection between one of a second subset of the first plurality of bumps and a second corresponding subset of the second plurality of bumps,
wherein, each of the first plurality of electrically conductive pathways and each of the second plurality of electrically conductive pathways has a length substantially equal to one another.

10. The microelectronic package bridge of claim 9, wherein the length of each of the first plurality of electrically conductive pathways and each of the second plurality of electrically conductive pathways is within about 1% to about 2% of one another.

11. The microelectronic package of claim 9, wherein the length of each of the first plurality of electrically conductive pathways and each of the second plurality of electrically conductive pathways varies by less than 100 microns.

12. The microelectronic package of claim 9, wherein the first signal layer and the second signal layer each includes a plurality of ground pathways.

13. The microelectronic package of claim 12, wherein a first distance is between each of the plurality of electrically conductive pathways within a respective signal layer and a second distance is between at least one of the electrically conductive pathways and at least one of the plurality of ground pathways within the respective signal layer, wherein the first distance is larger than the second distance.

14. The microelectronic package of claim 9, wherein each of the second plurality of electrically conductive pathways pass through a corresponding via to an adjacent ground layer.

15. The microelectronic package of claim 9, wherein the first die is a control die and the second die is a memory die.

16. A method of manufacturing a microelectronic package, the method comprising:
forming a first plurality of electrically conductive pathways in a first signal layer;
forming a second plurality of electrically conductive pathways in a second signal layer;
forming a ground layer positioned between the first signal layer and the second signal layer, the ground layer defining a plurality of vias, each of the second plurality of electrically conductive pathways passing through a respective via,
wherein forming the first plurality of electrically conductive pathways and the second plurality of electrically conductive pathways includes forming each of the first plurality of electrically conductive pathways and each of the second plurality of electrically conductive pathways such that each has a length substantially equal to one another; and
forming a plurality of ground pathways in each of the first signal layer and the second signal layer,
wherein forming each of the first plurality of electrically conductive pathways and each of the second plurality of electrically conductive pathways such that each has a length substantially equal to one another includes forming each of the first plurality of electrically conductive pathways and each of the second plurality of electrically conductive pathways such that a first distance is between each of the plurality of electrically conductive pathways within a respective signal layer and a second distance is between at least one of the electrically conductive pathways and at least one of the plurality of ground pathways within the respective signal layer, wherein the first distance is larger than the second distance.

17. The method of claim 16, wherein forming each of the first plurality of electrically conductive pathways and each of the second plurality of electrically conductive pathways such that each has a length substantially equal to one another includes forming each of the first plurality of electrically conductive pathways and each of the second plurality of electrically conductive pathways such that the length of each of the first plurality of electrically conductive pathways and each of the second plurality of electrically conductive pathways is within about 1% to about 2% of one another.

18. The method of claim 16, wherein forming each of the first plurality of electrically conductive pathways and each of the second plurality of electrically conductive pathways such that each has a length substantially equal to one another includes forming each of the first plurality of electrically conductive pathways and each of the second plurality of electrically conductive pathways such that the length of each of the first plurality of electrically conductive pathways and each of the second plurality of electrically conductive pathways varies by less than 100 microns.

19. The method of claim 16, further comprising providing a first die and a second die, each of the first plurality of electrically conductive pathways and each of the second plurality of electrically conductive pathways forming an electrical connection between a bump of the first die and bump of the second die.

20. A microelectronic package comprising:
a first die including a first plurality of bumps defining a first bump pattern;
a second die including a second plurality of bumps defining a second bump pattern; and
a bridge including:
a plurality of ground layers, and
a plurality of signal layers interwoven with the plurality of ground layers, each of the signal layers including a plurality of electrically conductive pathways and a plurality of ground pathways, each of the electrically conductive pathways forming an electrical connection between one of the first plurality of bumps and one of the second plurality of bumps,
wherein, each of the plurality of electrically conductive pathways has a length substantially equal to one another, and
wherein a first distance is between each of the plurality of electrically conductive pathways within a respective signal layer and a second distance is between at least one of the electrically conductive pathways and at least one of the plurality of ground pathways within the respective signal layer, wherein the first distance is greater than the second distance.

21. The microelectronic package of claim 20, wherein the length of each of the plurality of electrically conductive pathways is within about 1% to about 2% of one another.

* * * * *